US009035173B2

United States Patent
Naito et al.

(10) Patent No.: US 9,035,173 B2
(45) Date of Patent: May 19, 2015

(54) BACK ELECTRODE TYPE SOLAR CELL, BACK ELECTRODE TYPE SOLAR CELL WITH INTERCONNECTION SHEET, SOLAR CELL MODULE, METHOD OF MANUFACTURING BACK ELECTRODE TYPE SOLAR CELL WITH INTERCONNECTION SHEET, AND METHOD OF MANUFACTURING SOLAR CELL MODULE

(75) Inventors: Shinsuke Naito, Osaka (JP); Yasushi Sainoo, Osaka (JP); Tomohiro Nishina, Osaka (JP); Kohjiroh Morii, Osaka (JP); Tomoyo Shiraki, Osaka (JP); Akiko Tsunemi, Osaka (JP); Takayuki Yamada, Osaka (JP); Masatomo Tanahashi, Osaka (JP); Koji Fukuda, Osaka (JP)

(73) Assignee: SHARP KABUSHIKI KAISHA, Osaka-shi, Osaka (JP)

( * ) Notice: Subject to any disclaimer, the term of this patent is extended or adjusted under 35 U.S.C. 154(b) by 0 days.

(21) Appl. No.: 13/990,134

(22) PCT Filed: Nov. 29, 2011

(86) PCT No.: PCT/JP2011/077538
§ 371 (c)(1),
(2), (4) Date: Jul. 16, 2013

(87) PCT Pub. No.: WO2012/073957
PCT Pub. Date: Jun. 7, 2012

(65) Prior Publication Data
US 2013/0284260 A1    Oct. 31, 2013

(30) Foreign Application Priority Data
Nov. 30, 2010 (JP) .................................. 2010-267232

(51) Int. Cl.
*H01L 31/02* (2006.01)
*H01L 31/18* (2006.01)
(Continued)

(52) U.S. Cl.
CPC .. *H01L 31/02013* (2013.01); *H01L 31/022441* (2013.01); *H01L 31/048* (2013.01); *H01L 31/0516* (2013.01); *Y02E 10/50* (2013.01); *H01L 31/18* (2013.01)

(58) Field of Classification Search
CPC ............ H01L 31/022441; H01L 31/18; H01L 31/0516
USPC ............................................. 136/256; 438/64
See application file for complete search history.

(56) References Cited

U.S. PATENT DOCUMENTS

| 4,838,952 A | * | 6/1989 | Dill et al. ....................... 136/256 |
| 5,973,260 A | * | 10/1999 | Tange et al. .................... 136/256 |

(Continued)

FOREIGN PATENT DOCUMENTS

| CN | 102804393 A | 11/2012 |
| JP | 2005-340362 | 12/2005 |

(Continued)

OTHER PUBLICATIONS

International Search Report for PCT/JP2011/077538, mailed Feb. 7, 2012.

*Primary Examiner* — Golam Mowla
(74) *Attorney, Agent, or Firm* — Nixon & Vanderhye, P.C.

(57) ABSTRACT

A back electrode type solar cell in which a no-electrode-formed region where no electrode is placed is provided in a part of a peripheral portion of a back surface of the back electrode type solar cell such that a line connecting end portions of a plurality of electrodes to one another includes a partially inwardly recessed region and the no-electrode-formed region is located adjacent to each of an electrode for n-type and an electrode for p-type adjacent to each other, a solar cell module, a method of manufacturing a back electrode type solar cell with interconnection sheet, and a method of manufacturing a solar cell module are provided.

14 Claims, 10 Drawing Sheets

(51) Int. Cl.
*H01L 31/0224* (2006.01)
*H01L 31/048* (2014.01)
*H01L 31/05* (2014.01)

(56) References Cited

U.S. PATENT DOCUMENTS

| | | | |
|---|---|---|---|
| 6,927,417 B2* | 8/2005 | Nagashima et al. | 257/55 |
| 7,718,888 B2* | 5/2010 | Cousins | 136/243 |
| 7,959,831 B2* | 6/2011 | Akimoto | 252/514 |
| 2005/0172996 A1* | 8/2005 | Hacke et al. | 136/256 |
| 2009/0223562 A1* | 9/2009 | Niira et al. | 136/256 |
| 2010/0200058 A1* | 8/2010 | Funakoshi | 136/256 |
| 2010/0263718 A1 | 10/2010 | Abiko | |
| 2011/0023956 A1* | 2/2011 | Harder | 136/256 |
| 2011/0023962 A1* | 2/2011 | Fukui et al. | 136/256 |
| 2011/0041908 A1* | 2/2011 | Harder | 136/256 |
| 2012/0103415 A1 | 5/2012 | Sainoo et al. | |
| 2012/0291846 A1 | 11/2012 | Mikami et al. | |

FOREIGN PATENT DOCUMENTS

| | | |
|---|---|---|
| JP | 2008-311291 | 12/2008 |
| JP | 2010-161309 | 7/2010 |
| JP | 2010-161310 | 7/2010 |
| JP | 2011-3854 | 1/2011 |
| JP | 2011-138929 | 7/2011 |
| JP | 2011-151262 | 8/2011 |
| JP | 2012-9503 | 1/2012 |
| WO | WO 2009/060753 | 5/2009 |
| WO | WO 2010/150735 | 12/2010 |

* cited by examiner

BACK ELECTRODE TYPE SOLAR CELL, BACK ELECTRODE TYPE SOLAR CELL WITH INTERCONNECTION SHEET, SOLAR CELL MODULE, METHOD OF MANUFACTURING BACK ELECTRODE TYPE SOLAR CELL WITH INTERCONNECTION SHEET, AND METHOD OF MANUFACTURING SOLAR CELL MODULE

This application is the U.S. national phase of International Application No. PCT/JP2011/077538 filed 29 Nov. 2011 which designated the U.S. and claims priority to JP Application No. 2010-267232 filed 30 Nov. 2010, the entire contents of each of which are hereby incorporated by reference.

TECHNICAL FIELD

The present invention relates to a back electrode type solar cell, a back electrode type solar cell with interconnection sheet, a solar cell module, a method of manufacturing a back electrode type solar cell with interconnection sheet, and a method of manufacturing a solar cell module.

BACKGROUND ART

In recent years, in particular from a point of view of protection of global environment, expectation for a solar cell converting solar energy to electric energy as a next-generation energy source has rapidly increased. There are various types of solar cells such as a solar cell including a compound semiconductor and a solar cell including an organic material, and a solar cell including silicon crystal has currently been mainstream.

Solar cells currently manufactured and marketed most are bifacial solar cells constructed such that an n electrode is formed on a surface on a side where solar rays are incident (a light receiving surface) and a p electrode is formed on a surface opposite to the light receiving surface (a back surface), however, a back electrode type solar cell higher in power generation efficiency has also been developed.

For example, PTD 1 (Japanese Patent Laying-Open No. 2005-340362) discloses a back electrode type solar cell in which no electrode is formed on a light receiving surface of a solar cell but an n electrode and a p electrode are formed only on a back surface of the solar cell.

In addition, PTD 1 discloses a technique for electrically connecting an electrode of the back electrode type solar cell and a wire of an interconnection sheet to each other.

PTD 2 (WO2009/060753) discloses a technique for electrically connecting an electrode of a back electrode type solar cell and a wire of an interconnection sheet to each other by bringing them in direct contact with each other.

CITATION LIST

Patent Document

PTD 1: Japanese Patent Laying-Open No. 2005-340362
PTD 2: WO2009/060753

SUMMARY OF INVENTION

Technical Problem

In PTD 1 above, in connecting the back electrode type solar cell and the interconnection sheet to each other with one being superimposed on the other, registration between the electrode of the back electrode type solar cell and the wire of the interconnection sheet is made.

In electrically connecting the electrode of the back electrode type solar cell and the wire of the interconnection sheet to each other, solder is placed on at least one of the electrode of the back electrode type solar cell and the wire of the interconnection sheet and the solder may be cured at the same time as registration between the electrode of the back electrode type solar cell and the wire of the interconnection sheet. Simply connecting the electrode and the wire to each other with the use of the solder, however, is not sufficient in mechanical connection strength between the back electrode type solar cell and the interconnection sheet. In particular, when stress is directly applied to the electrode of the back electrode type solar cell, the electrode of the back electrode type solar cell and the wire of the interconnection sheet are detached from each other and electrical connection between these members can no longer be held.

In addition, in PTD 2, a sealing material seals the back electrode type solar cell and the interconnection sheet so that the electrode of the back electrode type solar cell and the wire of the interconnection sheet are press-fitted to and brought in direct contact with each other by securing force of the sealing material. Thus, insufficient mechanical connection strength between the back electrode type solar cell and the interconnection sheet above can be suppressed. In order to obtain high conversion efficiency and high reliability, however, there is also a demand for use of the technique for connecting an electrode and a wire to each other with such a conductive material as solder as described in PTD 1.

As means for solving the problems above, a technique for mechanically connecting a back electrode type solar cell and an interconnection sheet to each other by applying an insulating resin containing conductive particles such as solder or a conductive adhesive material such as solder cream to an electrode or a wire, thereafter heating the resin to thereby electrically connect the electrode and the wire to each other through the conductive adhesive material, and curing an insulating adhesive material such as a sealing material arranged between the back electrode type solar cell and the interconnection sheet has also been developed.

In this technique, the electrode and the wire can electrically be connected to each other by means of the conductive adhesive material and direct application of stress to each of the electrode of the back electrode type solar cell and the wire of the interconnection sheet can be suppressed. Therefore, this technique has attracted attention as a technique for connection between an electrode and a wire for a solar cell module required to achieve a high current and high reliability.

In this case, as described in PTD 2, preferably, the back electrode type solar cell is positioned with respect to the interconnection sheet, thereafter it is provisionally fixed by a fixing tape, and they are sealed with a sealing material in that state.

In a case of provisional fixing with a fixing tape, however, the fixing tape can be seen through a light receiving surface of a solar cell module, which impairs design quality. In addition, in a case of registration of a back electrode type solar cell with respect to an interconnection sheet as well, in provisional fixing by a fixing tape, registration may become inaccurate because of contact with the back electrode type solar cell and/or the interconnection sheet. Therefore, a method of fixing the back electrode type solar cell and the interconnection sheet by applying and curing a fluid resin such as a transparent resin or an ultraviolet curable resin instead of a fixing tape is considered as a more preferred method.

From the foregoing results of studies, it is considered that, among solar cell modules in which a back electrode type solar cell and an interconnection sheet are sealed in a sealing material, a solar cell module fabricated by performing the following steps (1) to (5) in this order is a solar cell module in accordance with a preferred embodiment. It is noted that the step (3) below may be performed prior to the step (2).

(1) The step of placing a conductive adhesive material on an electrode of a back electrode type solar cell and/or a wire of an interconnection sheet.

(2) The step of making registration between the back electrode type solar cell and the interconnection sheet such that the electrode of the back electrode type solar cell is opposed to a prescribed position of the wire of the interconnection sheet.

(3) The step of arranging a fixing resin such as a fluid transparent resin or an ultraviolet curable resin without direct contact with the electrode of the back electrode type solar cell and the wire of the interconnection sheet with such a method as dripping the fixing resin between the back electrode type solar cell and the interconnection sheet.

(4) The step of provisionally fixing the back electrode type solar cell and the interconnection sheet by curing the fixing resin.

(5) The step of mechanically connecting the back electrode type solar cell and the interconnection sheet to each other by sealing the back electrode type solar cell and the interconnection sheet with a sealing material, heating the conductive adhesive material placed between the back electrode type solar cell and the interconnection sheet to thereby achieve electrical connection with the conductive adhesive material being located between the electrode and the wire, and curing an insulating adhesive material such as the sealing material.

In a case where the fixing resin arranged in the step (3) above flows and it comes in contact with the conductive adhesive material arranged in the step (1), however, if the conductive adhesive material is also in an uncured paste state, it will be mixed with the fixing resin. Therefore, the conductive adhesive material disadvantageously flows out in between the electrodes of the solar cell and/or the wires of the interconnection sheet through the fixing resin, leading to short-circuiting between the electrodes and/or the wires. In addition, in this case, stability in mechanical connection between the solar cell and the interconnection sheet is also impaired.

In view of the circumstances above, an object of the present invention is to provide a back electrode type solar cell capable of achieving improved stability in mechanical connection between a back electrode type solar cell and an interconnection sheet and improved stability in electrical connection between an electrode of the back electrode type solar cell and a wire of the interconnection sheet, a back electrode type solar cell with interconnection sheet, a solar cell module, a method of manufacturing a back electrode type solar cell with interconnection sheet, and a method of manufacturing a solar cell module.

Solution to Problem

The present invention is directed to a back electrode type solar cell including a substrate and a plurality of electrodes provided on a back surface which is one surface of the substrate, in which, in a part of a peripheral portion of the back surface of the back electrode type solar cell, a no-electrode-formed region where no electrode is placed is provided such that a line connecting end portions of the plurality of electrodes to one another includes a partially inwardly recessed region, the plurality of electrodes include an electrode for n-type and an electrode for p-type adjacent to each other, and the no-electrode-formed region is located adjacent to each of the electrode for n-type and the electrode for p-type.

Here, in the back electrode type solar cell according to the present invention, preferably, the no-electrode-formed region is a round or polygonal region of which length of a portion in contact with the part of the peripheral portion of the back surface of the back electrode type solar cell is longest.

In addition, in the back electrode type solar cell according to the present invention, preferably, at least two no-electrode-formed regions are provided in the back surface of the back electrode type solar cell.

In addition, in the back electrode type solar cell according to the present invention, preferably, at least two no-electrode-formed regions are provided in the vicinity of the parts of the peripheral portion located diagonally, respectively, with a center of the back surface of the back electrode type solar cell lying therebetween.

In addition, in the back electrode type solar cell according to the present invention, preferably, an alignment mark different in surface shape from the electrode for n-type and the electrode for p-type is provided in a region around the no-electrode-formed region.

In addition, in the back electrode type solar cell according to the present invention, preferably, an alignment mark different in surface shape from the electrode for n-type and the electrode for p-type is provided in an inner region of the no-electrode-formed region.

In addition, the present invention is directed to a back electrode type solar cell with interconnection sheet including the above-described back electrode type solar cell, an interconnection sheet having an insulating base member and a wire provided on at least one surface of the insulating base member, a conductive adhesive material located between the electrode of the back electrode type solar cell and the wire of the interconnection sheet, for electrically connecting the electrode and the wire to each other, and an insulating adhesive material located between the no-electrode-formed region of the back electrode type solar cell and an opposing region of the interconnection sheet opposed to the no-electrode-formed region, for mechanically connecting the no-electrode-formed region and the opposing region to each other, in which the back electrode type solar cell includes the substrate and the electrode provided on the back surface which is one surface of the substrate, the no-electrode-formed region where no electrode is placed is provided in the part of the peripheral portion of the back surface of the back electrode type solar cell, the electrode includes the electrode for n-type and the electrode for p-type adjacent to each other, and the no-electrode-formed region is located adjacent to each of the electrode for n-type and the electrode for p-type.

In addition, the present invention is directed to a back electrode type solar cell with interconnection sheet including the above-described back electrode type solar cell, an interconnection sheet having an insulating base member and a wire provided on at least one surface of the insulating base member, a conductive adhesive material located between the electrode of the back electrode type solar cell and the wire of the interconnection sheet, for electrically connecting the electrode and the wire to each other, and an insulating adhesive material located between the no-electrode-formed region of the back electrode type solar cell and an opposing region of the interconnection sheet opposed to the no-electrode-formed region, for mechanically connecting the no-electrode-formed region and the opposing region to each other, in which no conductive adhesive material is placed on the alignment mark.

Here, in the back electrode type solar cell with interconnection sheet according to the present invention, preferably, the conductive adhesive material and the insulating adhesive material are located at a distance from each other.

In addition, the present invention is directed to a solar cell module including a light-transmitting substrate, a protection base member, a sealing material located between the light-transmitting substrate and the protection base member, and the above-described back electrode type solar cell with interconnection sheet sealed in the sealing material.

In addition, the present invention is directed to a method of manufacturing the above-described back electrode type solar cell with interconnection sheet, including the steps of placing a conductive adhesive material on at least one of the electrode of the back electrode type solar cell and the wire of the interconnection sheet, placing an insulating adhesive material on at least one of the no-electrode-formed region of the back electrode type solar cell and the opposing region of the interconnection sheet, superimposing the back electrode type solar cell and the interconnection sheet on each other, curing the insulating adhesive material, and curing the conductive adhesive material after it is molten, in which during a period from placement of the insulating adhesive material until curing of the insulating adhesive material, the conductive adhesive material and the insulating adhesive material are located at a distance from each other.

In addition, the present invention is directed to a method of manufacturing the above-described back electrode type solar cell with interconnection sheet, including the steps of placing a conductive adhesive material on at least one of the electrode of the back electrode type solar cell and the wire of the interconnection sheet, placing an insulating adhesive material on at least one of the no-electrode-formed region of the back electrode type solar cell and the opposing region of the interconnection sheet, superimposing the back electrode type solar cell and the interconnection sheet on each other such that the alignment mark of the back electrode type solar cell is opposed to a prescribed surface region of the interconnection sheet, curing the insulating adhesive material, and curing the conductive adhesive material after it is molten, in which during a period from placement of the insulating adhesive material until curing of the insulating adhesive material, the conductive adhesive material and the insulating adhesive material are located at a distance from each other.

Here, in the method of manufacturing the back electrode type solar cell with interconnection sheet according to the present invention, preferably, the conductive adhesive material is contained in a solder resin.

Furthermore, the present invention is directed to a method of manufacturing the above-described solar cell module, including the steps of placing a conductive adhesive material on at least one of the electrode of the back electrode type solar cell and the wire of the interconnection sheet, placing an insulating adhesive material on at least one of the no-electrode-formed region of the back electrode type solar cell and the opposing region of the interconnection sheet, superimposing the back electrode type solar cell and the interconnection sheet on each other, curing the insulating adhesive material, and sealing the back electrode type solar cell and the interconnection sheet in a sealing material between the light-transmitting substrate and the protection base member, in which, in the sealing step, the step of curing the conductive adhesive material after it is molten is performed, and during a period from placement of the insulating adhesive material until curing of the insulating adhesive material, the conductive adhesive material and the insulating adhesive material are located at a distance from each other.

Advantageous Effects of Invention

According to the present invention, a back electrode type solar cell capable of achieving improved stability in mechanical connection between a back electrode type solar cell and an interconnection sheet and improved stability in electrical connection between an electrode of the back electrode type solar cell and a wire of the interconnection sheet, a back electrode type solar cell with interconnection sheet, a solar cell module, a method of manufacturing a back electrode type solar cell with interconnection sheet, and a method of manufacturing a solar cell module can be provided.

DESCRIPTION OF EMBODIMENTS

Figure 1:
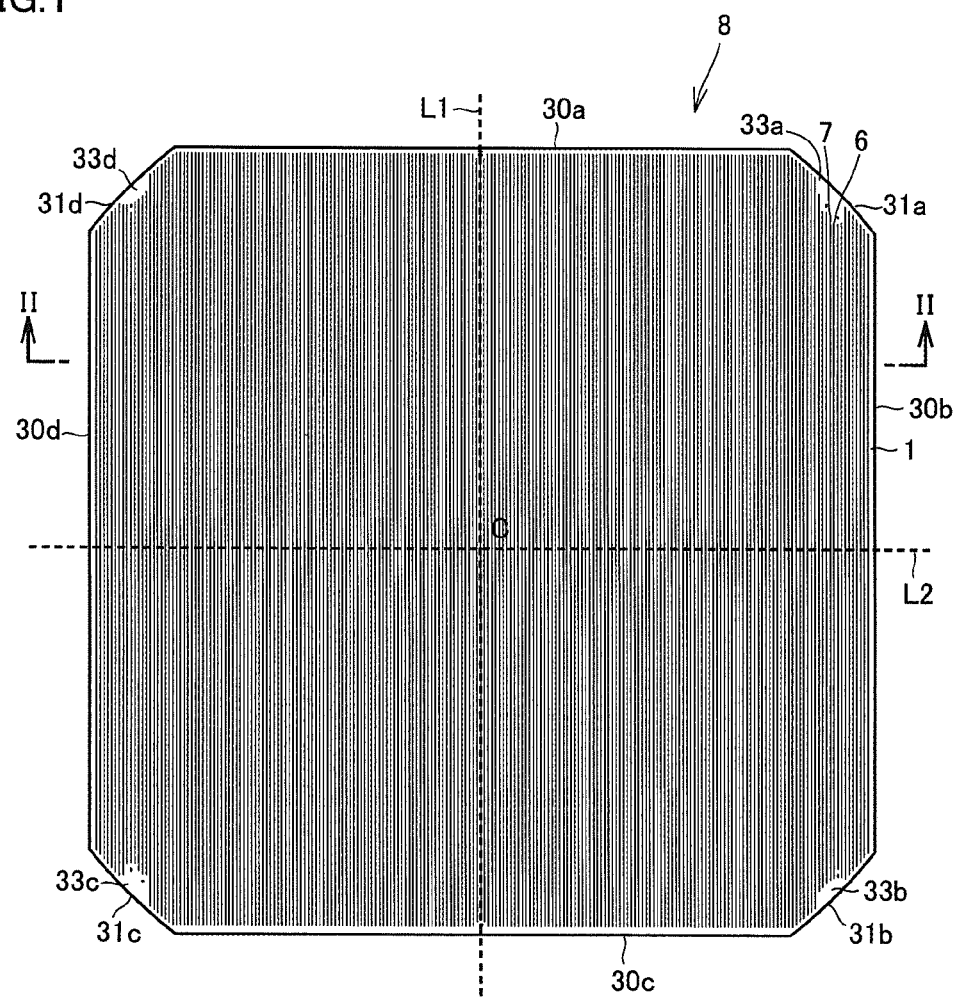
FIG. 1 is a schematic plan view of a back surface of a back electrode type solar cell in the present embodiment.

An embodiment of the present invention will be described hereinafter. It is noted that, in the drawings of the present invention, the same or corresponding elements have the same reference characters allotted.

<Back Electrode Type Solar Cell>

FIG. 1 shows a schematic plan view of a back surface of a back electrode type solar cell in the present embodiment, which is one example of the back electrode type solar cell according to the present invention. A back electrode type solar cell 8 includes a substrate 1 and an electrode provided on a back surface of substrate 1. Here, the electrode includes a band-shaped electrode for n-type 6 and a band-shaped electrode for p-type 7.

Band-shaped electrode for n-type 6 and band-shaped electrode for p-type 7 are alternately aligned one by one at a distance from each other on the back surface of substrate 1 and they are formed over substantially the entire back surface of back electrode type solar cell 8.

In the present embodiment, the back surface of back electrode type solar cell 8 is octagonal. A peripheral portion of the back surface of back electrode type solar cell 8 is constituted of parts 30a, 30b, 30c, 30d of the peripheral portion each having a relatively long length and parts 31a, 31b, 31c, 31d of the peripheral portion each having a relatively short length.

Then, in the vicinity of parts 31a, 31b, 31c, 31d of the peripheral portion of the back surface of back electrode type solar cell 8, no-electrode-formed regions 33a, 33b, 33c, 33d where no electrode is placed are provided, respectively.

Parts 31a and 31c of the peripheral portion of the back surface of back electrode type solar cell 8 are located diagonally with a center C of the back surface of back electrode type solar cell 8 lying therebetween. In addition, parts 31b and 31d of the peripheral portion are also located diagonally with center C of the back surface of back electrode type solar cell 8 lying therebetween.

Here, center C of the back surface of back electrode type solar cell 8 is defined as an intersection between a virtual line L1 connecting to each other, intermediate points of parts 30a and 30c of the peripheral portion facing each other and a virtual line L2 connecting to each other, intermediate points of parts 30b and 30d of the peripheral portion facing each other.

Figure 2:
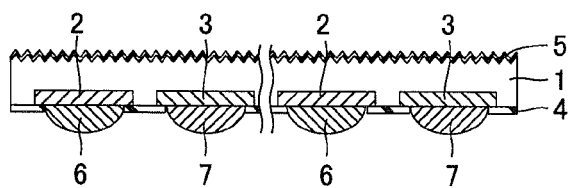
FIG. 2 is a schematic cross-sectional view along II-II in FIG. 1.

FIG. 2 shows a schematic cross-section along II-II in FIG. 1. An n-type impurity diffusion region 2 and a p-type impurity diffusion region 3 are formed in the back surface of substrate 1, and a passivation film 4 is formed on a part of the back surface of substrate 1. Then, electrode for n-type 6 is formed on n-type impurity diffusion region 2 in a region where passivation film 4 is not formed, and electrode for p-type 7 is formed on p-type impurity diffusion region 3 where passivation film 4 is not formed.

In addition, a textured structure is formed in a light receiving surface of substrate 1 and an anti-reflection coating 5 is formed on the textured structure.

In order to efficiently extract electrons or holes generated by light incident on a pn junction portion of back electrode type solar cell 8, n-type impurity diffusion region 2 and p-type impurity diffusion region 3 are preferably arranged adjacent to each other in the back surface of substrate 1, and n-type impurity diffusion region 2 and p-type impurity diffusion region 3 are more preferably in contact with electrode for n-type 6 and electrode for p-type 7, respectively.

Then, since back electrode type solar cell 8 has an electrode (electrode for n-type 6 and electrode for p-type 7) on the back surface opposite to the light receiving surface, light incident loss (shadow loss) caused by an electrode on the light receiving surface does not take place. Therefore, in back electrode type solar cell 8, in order to efficiently extract generated electric power of back electrode type solar cell 8, electrode for n-type 6 and electrode for n-type 7 are preferably arranged over the entire back surface of back electrode type solar cell 8. Regarding the entire surface, in consideration of tolerance or accuracy in forming the pn junction portion of back electrode type solar cell 8, electrode for n-type 6, and electrode for p-type 7 on substrate 1, the pn junction portion of back electrode type solar cell 8, electrode for n-type 6, and electrode for p-type 7 should only avoid extending off substrate 1. For example, in a case where substrate 1 has a side around 150 mm, electrode for n-type 6 and electrode for p-type 7 are preferably formed in a region inside by approximately 2 mm from the peripheral portion of substrate 1, and furthermore, electrode for n-type 6 and electrode for p-type 7 are preferably formed in a region inside by approximately 1 mm from the peripheral portion of substrate 1. Thus, in a case where electrode for n-type 6 and electrode for p-type 7 are formed even in the vicinity of the peripheral portion of the back surface of back electrode type solar cell 8, generated electric power of back electrode type solar cell 8 tends to efficiently be extracted.

Figure 3:
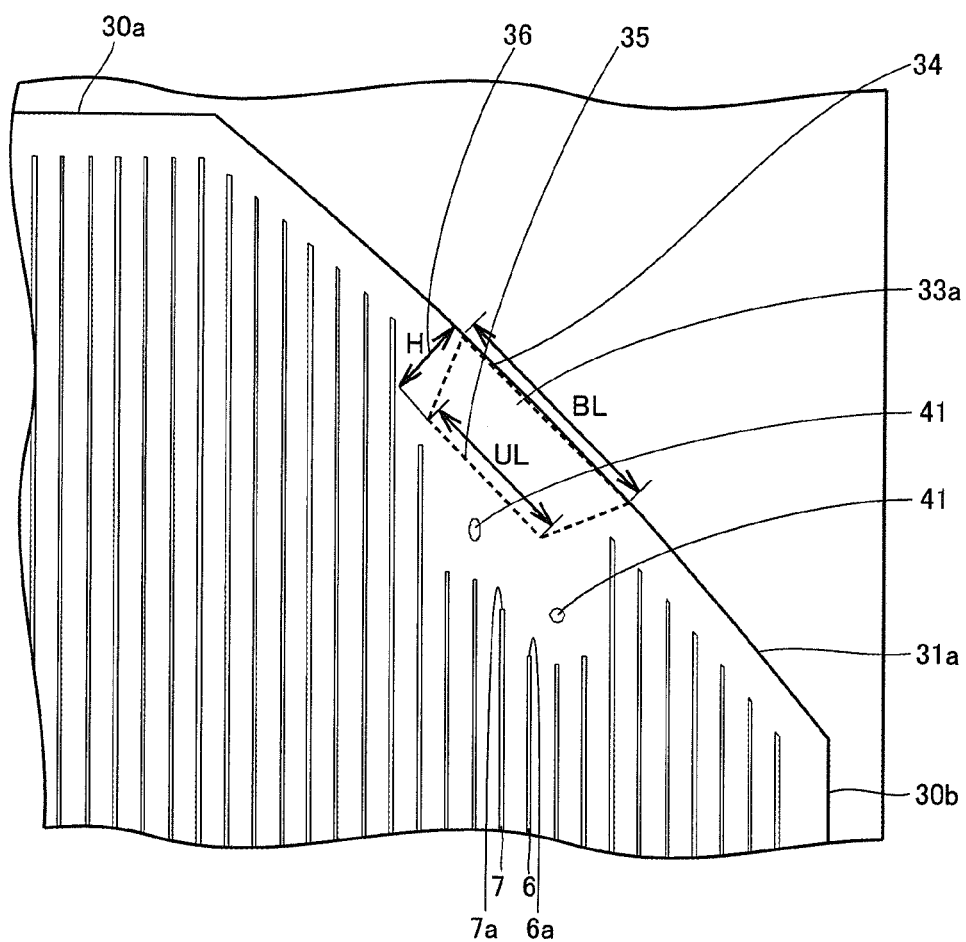
FIG. 3 is a schematic enlarged plan view of a no-electrode-formed region in FIG. 1.

FIG. 3 shows a schematic enlarged plan view of no-electrode-formed region 33a in FIG. 1. In the present embodiment, no-electrode-formed region 33a is a trapezoidal region, a lower base 34 of trapezoidal no-electrode-formed region 33a is a line segment in contact with a part of part 31a of the peripheral portion, and an upper base 35 is a line segment in parallel to lower base 34, which is spaced apart by a height 36 perpendicular to lower base 34. Here, a length BL of lower base 34 is, for example, not smaller than 1 mm and not greater than 10 mm and a length UL of upper base 35 is, for example, not smaller than 1 mm and not greater than 10 mm. In addition, a length H of height 36 is, for example, not smaller than 1 mm and not greater than 10 mm.

Length BL, length UL, and length H above can also be applied to respective lengths of the lower base, the upper base, and the height of other trapezoidal no-electrode-formed regions 33b, 33c, 33d. In addition, the lower bases of trapezoidal no-electrode-formed regions 33b, 33c, 33d are line segments in contact with parts of parts 31b, 31c, 31d of the peripheral portion, respectively.

It is noted that a shape of no-electrode-formed region 33a, 33b, 33c, 33d is not limited to a trapezoid, and although not particularly limited, it is preferably a round or polygonal region of which length of a portion in contact with part 31a, 31b, 31c, 31d of the peripheral portion of the back surface of back electrode type solar cell 8 is longest. In this case, since a wide region where an electrode is formed can readily be secured in the back surface of back electrode type solar cell 8, generated electric power of back electrode type solar cell 8 tends to more efficiently be extracted. It is noted that the "round" herein means a shape not having a corner and does not necessarily require a shape of a perfect circle.

In addition, no-electrode-formed region 33a, 33b, 33c, 33d is preferably provided such that a line connecting end portions of a plurality of electrodes includes a partially inwardly recessed region.

As shown in FIG. 3, electrode for n-type 6 and electrode for p-type 7 adjacent to each other are located next to no-electrode-formed region 33a. In the example shown in FIG. 3, an end portion 6a of electrode for n-type 6 or an end portion 7a of electrode for p-type 7 is located adjacent to no-electrode-formed region 33a.

In addition, as shown in FIG. 3, in a region around no-electrode-formed region 33a, an alignment mark 41 different in surface shape from electrode for n-type 6 and electrode for p-type 7 is preferably provided. Thus, by providing alignment mark 41 on the back surface of back electrode type solar cell 8, registration between an interconnection sheet and back electrode type solar cell 8 which will be described later tends to be more accurate. It is noted that, in the present embodiment, electrode for n-type 6 and electrode for p-type 7 are each in a band shape, one of alignment marks 41 is oval, and the other of alignment marks 41 is circular.

A shortest distance between no-electrode-formed region 33a and alignment mark 41 is preferably not grater than 2 mm and more preferably not greater than 1 mm. From a point of view of more accurate registration between an interconnection sheet and back electrode type solar cell 8 which will be described later, alignment mark 41 is preferably provided on the back surface of back electrode type solar cell 8. From a region in the back surface of back electrode type solar cell 8 where alignment mark 41 is formed, however, generated electric power cannot be extracted. Therefore, by arranging alignment mark 41 in the region around no-electrode-formed region 33a which is a region from which generated electric power cannot similarly be extracted and setting the shortest distance between no-electrode-formed region 33a and alignment mark 41 preferably to 2 mm or smaller and more preferably to 1 mm or smaller, a region from which generated electric power can be extracted (a region where an electrode is formed) can be made greater. Thus, lowering in power generation efficiency tends to be suppressed.

Figure 4:
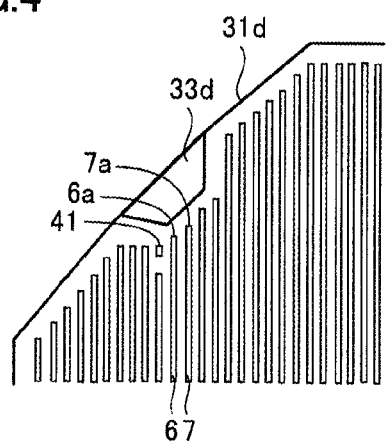
FIG. 4 is a schematic enlarged plan view of a no-electrode-formed region in FIG. 1.

FIG. 4 shows a schematic enlarged plan view of no-electrode-formed region 33d in FIG. 1. Here, trapezoidal no-electrode-formed region 33d is located next to electrode for n-type 6 and electrode for p-type 7 which are adjacent to each other. In the example shown in FIG. 4, no-electrode-formed region 33d is arranged adjacent to end portion 6a of electrode for n-type 6 or end portion 7a of electrode for p-type 7 arranged adjacently to that electrode for n-type 6 at a distance therefrom.

In addition, alignment mark 41 is arranged in a region around no-electrode-formed region 33d, at a position adjacent to electrode for n-type 6 at a distance therefrom. Here again, a surface shape of alignment mark 41 is rectangular, which is different in shape from band-shaped electrode for n-type 6 and electrode for p-type 7. It is noted that a preferred range of the shortest distance between no-electrode-formed region 33d and alignment mark 41 and the reason therefor are the same as described above.

Figure 5:
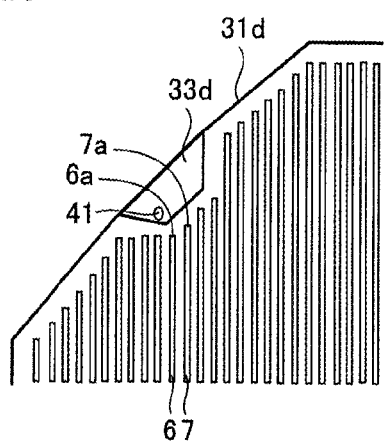
FIG. 5 is a schematic enlarged plan view of another example of the no-electrode-formed region in FIG. 1.

FIG. 5 is a schematic enlarged plan view of another example of no-electrode-formed region 33d in FIG. 1. Here, the feature resides in that alignment mark 41 is provided in an inner region of no-electrode-formed region 33d. By thus providing alignment mark 41 in the inner region of no-electrode-formed region 33d, a region from which generated electric power can be extracted (a region where an electrode is formed) can further be made greater, so that lowering in power generation efficiency tends to further be suppressed. It is noted that a surface shape of alignment mark 41 shown in FIG. 5 is oval, which is different in shape from band-shaped electrode for n-type 6 and electrode for p-type 7.

It is noted that a shape of the back surface of back electrode type solar cell 8 is not limited to octagonal and it may be, for example, quadrangular or in such a shape as any corner of a quadrangle being cut off. Even when a shape of the back surface of back electrode type solar cell 8 is quadrangular or in such a shape as any corner of a quadrangle being cut off, no-electrode-formed regions 33a and 33c as well as 33b and 33d are preferably located in the peripheral portion diagonally around opposing corners with center C of the back surface of back electrode type solar cell 8 lying therebetween.

<Method of Manufacturing Back Electrode Type Solar Cell>

One example of a method of manufacturing back electrode type solar cell 8 in the present embodiment will be described hereinafter with reference to schematic cross-sectional views in FIGS. 6 (a) to 6 (g).

Figure 6:
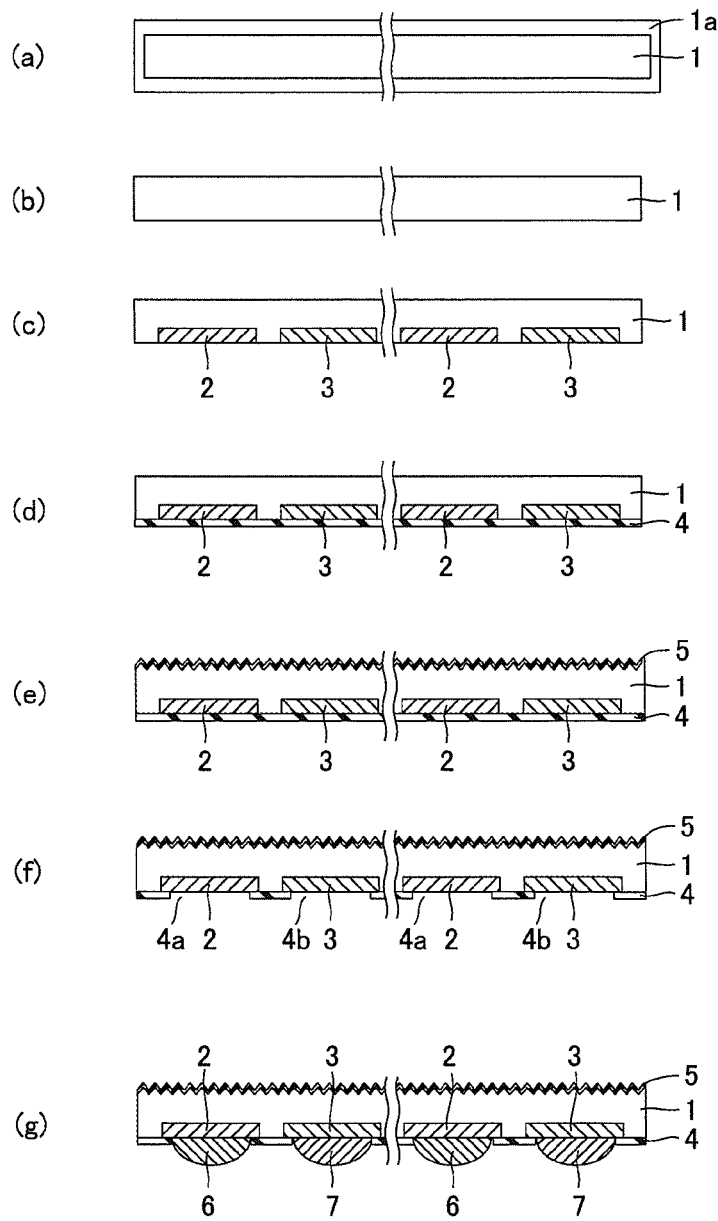
FIGS. 6 (a) to (g) are schematic cross-sectional views illustrating one example of a method of manufacturing a back electrode type solar cell in the present embodiment.

Initially, as shown in FIG. 6 (a), for example by slicing from an ingot or the like, substrate 1 having a slice damage 1a formed in the surface of substrate 1 is prepared. For example, a silicon substrate composed of polycrystalline silicon, single crystal silicon, or the like having any conductivity type of the n-type and the p-type can be employed as substrate 1.

Then, as shown in FIG. 6 (b), slice damage 1a at the surface of substrate 1 is removed. Here, for example, in a case where the silicon substrate above is employed as substrate 1, removal of slice damage 1a can be achieved by etching or the like the surface of the sliced silicon substrate above with a mixed acid of a hydrogen fluoride aqueous solution and nitric acid, an aqueous solution of such alkali as sodium hydroxide, or the like.

Though a size and a shape of semiconductor substrate 1 after removal of slice damage 1a are not particularly limited either, a thickness of semiconductor substrate 1 can be, for example, not smaller than 50 μm and not greater than 400 μm.

Then, as shown in FIG. 6 (c), n-type impurity diffusion region 2 and p-type impurity diffusion region 3 are formed in the back surface of substrate 1. N-type impurity diffusion region 2 can be formed, for example, with such a method as vapor phase diffusion using a gas containing an n-type impurity, and p-type impurity diffusion region 3 can be formed, for example, with such a method as vapor phase diffusion using a gas containing a p-type impurity.

N-type impurity diffusion region 2 and p-type impurity diffusion region 3 are each formed in a band shape extending toward a surface side and/or a back surface side of the sheet surface of FIG. 6, and n-type impurity diffusion region 2 and p-type impurity diffusion region 3 are arranged alternately at a prescribed distance from each other in the back surface of substrate 1.

N-type impurity diffusion region 2 is not particularly limited so long as it is a region containing an n-type impurity and exhibiting the n conductivity type. It is noted that an n-type impurity such as phosphorus can be employed as an n-type impurity.

P-type impurity diffusion region 3 is not particularly limited so long as it is a region containing a p-type impurity and exhibiting the p conductivity type. It is noted that a p-type impurity such as boron or aluminum can be employed as a p-type impurity.

For example, a gas containing such an n-type impurity as phosphorus, such as $POCl_3$, can be employed as a gas containing an n-type impurity, and a gas containing such a p-type impurity as boron, such as $BBr_3$, can be employed as a gas containing a p-type impurity.

Then, as shown in FIG. 6 (d), passivation film 4 is formed on the back surface of substrate 1. Here, passivation film 4 can be formed, for example, with such a method as a thermal oxidation method or a plasma CVD (Chemical Vapor Deposition) method.

For example, a silicon oxide film, a silicon nitride film, a stack of a silicon oxide film and a silicon nitride film, or the like can be employed as passivation film 4, however, passivation film 4 is not limited thereto.

A thickness of passivation film 4 can be, for example, not smaller than 0.05 μm and not greater than 1 μm, and it is set particularly preferably to around 0.2 μm.

Then, as shown in FIG. 6 (e), a projecting and recessed structure such as a textured structure is formed in the entire light receiving surface of substrate 1, and thereafter anti-reflection coating 5 is formed on that projecting and recessed structure.

The textured structure can be formed, for example, by etching the light receiving surface of substrate 1. For example, in a case where a silicon substrate is employed as substrate 1, the textured structure can be formed, for example, by etching the light receiving surface of substrate 1 by using an etchant obtained by heating a liquid obtained by adding isopropyl alcohol to an aqueous solution of such alkali as sodium hydroxide or potassium hydroxide, for example, to a temperature not lower than 70° C. and not higher than 80° C.

Anti-reflection coating 5 can be formed, for example, with a plasma CVD method or the like. It is noted that, for example, a silicon nitride film or the like can be employed as anti-reflection coating 5, however, anti-reflection coating 5 is not limited thereto.

Then, as shown in FIG. 6 (*f*), by removing a part of passivation film 4 on the back surface of substrate 1, a contact hole 4*a* and a contact hole 4*b* are formed. Here, contact hole 4*a* is formed to expose at least a part of the surface of n-type impurity diffusion region 2 and contact hole 4*b* is formed to expose at least a part of the surface of p-type impurity diffusion region 3.

It is noted that each of contact hole 4*a* and contact hole 4*b* can be formed, for example, with a method of forming a resist pattern having openings in portions corresponding to locations where contact hole 4*a* and contact hole 4*b* are to be formed in passivation film 4 with a photolithography technique and thereafter removing passivation film 4 through the openings in the resist pattern by etching or the like, a method of applying an etching paste to portions of passivation film 4 corresponding to locations where contact hole 4*a* and contact hole 4*b* are to be formed, thereafter carrying out heating, and removing by etching passivation film 4, or the like.

Then, as shown in FIG. 6 (*g*), electrode for n-type 6 in contact with n-type impurity diffusion region 2 through contact hole 4*a* and electrode for p-type 7 in contact with p-type impurity diffusion region 3 through contact hole 4*b* are formed and back electrode type solar cell 8 can thus be fabricated.

Here, the electrode of back electrode type solar cell 8 (electrode for n-type 6, electrode for p-type 7) and alignment mark 41 are preferably formed of the same material and with the same method. In this case, since the electrode of back electrode type solar cell 8 (electrode for n-type 6, electrode for p-type 7) and alignment mark 41 can simultaneously be formed with such a method as sputtering, efficiency in manufacturing back electrode type solar cell 8 can be improved.

<Back Electrode Type Solar Cell with Interconnection Sheet>

Figure 7:
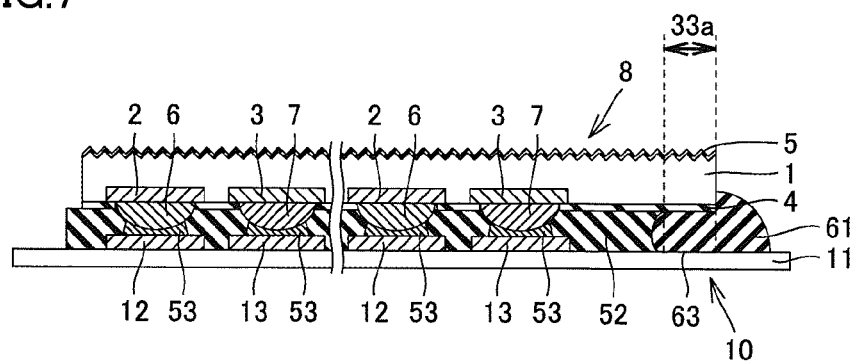
FIG. 7 is a schematic cross-sectional view of one example of a back electrode type solar cell with interconnection sheet in the present embodiment.

FIG. 7 shows a schematic cross-sectional view of a back electrode type solar cell with interconnection sheet in the present embodiment, which is one example of the back electrode type solar cell with interconnection sheet according to the present invention. The back electrode type solar cell with interconnection sheet includes back electrode type solar cell 8 and an interconnection sheet 10. Here, interconnection sheet 10 includes an insulating base member 11 and a wire for n-type 12 and a wire for p-type 13 provided on insulating base member 11.

Then, electrode for n-type 6 of back electrode type solar cell 8 and wire for n-type 12 of interconnection sheet 10 are electrically connected to each other by means of a conductive adhesive material 53. In addition, electrode for p-type 7 of back electrode type solar cell 8 and wire for p-type 13 of interconnection sheet 10 are electrically connected to each other by means of conductive adhesive material 53.

Moreover, an insulating adhesive material 61 is located between no-electrode-formed region 33*a* of back electrode type solar cell 8 and an opposing region 63 of interconnection sheet 10 opposed to no-electrode-formed region 33*a*, and insulating adhesive material 61 mechanically connects no-electrode-formed region 33*a* and opposing region 63 to each other.

Furthermore, in the example shown in FIG. 7, an insulating adhesive material 52 is located between a region other than no-electrode-formed region 33*a* of the back surface of back electrode type solar cell 8 and a region other than opposing region 63 of the surface of interconnection sheet 10, and insulating adhesive material 52 mechanically connects back electrode type solar cell 8 and interconnection sheet 10 to each other. By thus arranging insulating adhesive material 52 different from insulating adhesive material 61 also in the region other than no-electrode-formed region 33*a* of back electrode type solar cell 8, mechanical connection between back electrode type solar cell 8 and interconnection sheet 10 can be securer, which is more preferred. In the back electrode type solar cell with interconnection sheet shown in FIG. 7, conductive adhesive material 53 and insulating adhesive material 61 are located at a distance from each other. Thus, stability in mechanical connection between back electrode type solar cell 8 and interconnection sheet 10 is improved and stability in electrical connection between the electrode of back electrode type solar cell 8 and the wire of interconnection sheet 10 is also improved.

<Interconnection Sheet>

Figure 8:
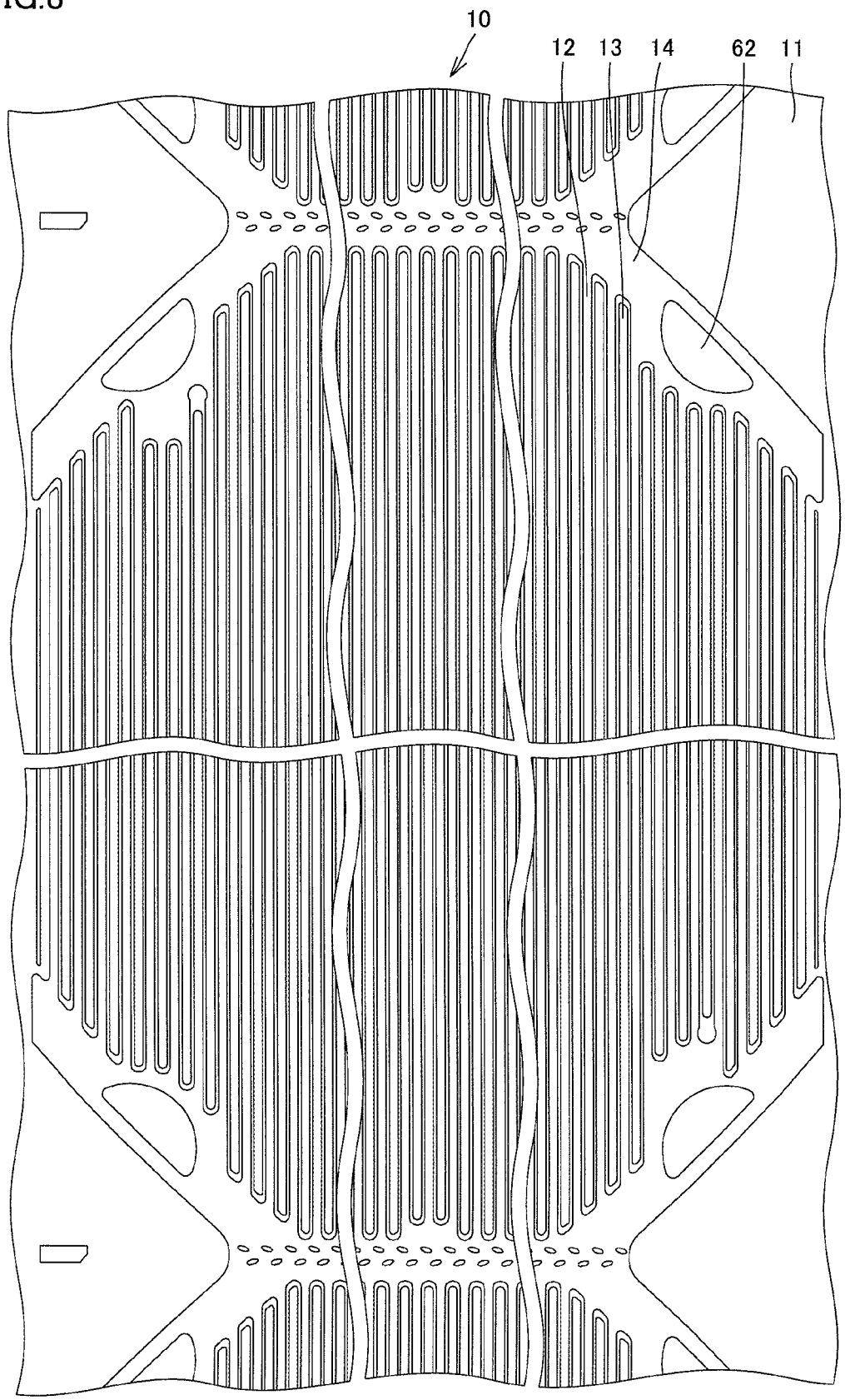
FIG. 8 is a schematic enlarged plan view of a surface on a side where a wire of an interconnection sheet employed in the present embodiment is placed.

FIG. 8 shows a schematic enlarged plan view of a surface on a side where the wires of interconnection sheet 10 employed in the present embodiment are placed. On the surface of insulating base member 11 of interconnection sheet 10, wire for n-type 12 and wire for p-type 13 are alternately formed in a band shape at a prescribed distance from each other. On the surface of insulating base member 11 of interconnection sheet 10, a wire for connection 14 is formed, which electrically connects wire for n-type 12 and wire for p-type 13 to each other.

At each of opposing ends of wire for connection 14, a recess 62 which is a region where a surface of insulating base member 11 is exposed through wire for connection 14 is formed.

In interconnection sheet 10 having the features above, wire for n-type 12 and wire for p-type 13 adjacent to each other in a longitudinal direction of each of wire for n-type 12 and wire for p-type 13 are electrically connected to each other through wire for connection 14. Therefore, back electrode type solar cells 8 placed adjacent to each other in the longitudinal direction above on interconnection sheet 10 are electrically connected to each other.

<Method of Manufacturing Interconnection Sheet>

Interconnection sheet 10 can be manufactured, for example, as follows. One example of a method of manufacturing interconnection sheet 10 employed in the present embodiment will be described hereinafter with reference to schematic cross-sectional views in FIGS. 9 (*a*) to 9 (*d*).

Figure 9:
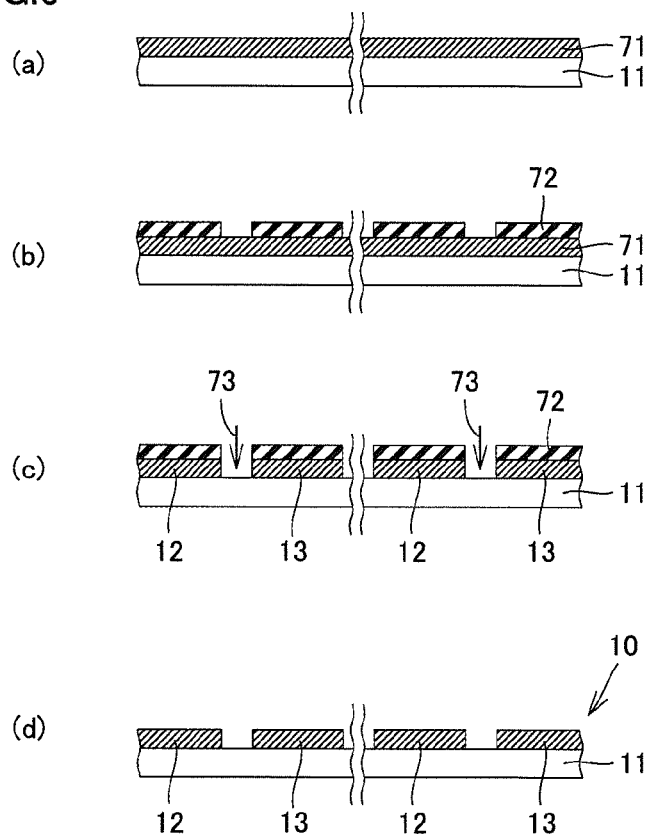
FIGS. 9 (a) to (d) are schematic cross-sectional views illustrating one example of a method of manufacturing an interconnection sheet employed in the present embodiment.

Initially, as shown in FIG. 9 (*a*), a conductive layer 71 formed from a conductive member is formed on the surface of insulating base member 11. A substrate composed, for example, of such a resin as polyester, polyethylene naphthalate, or polyimide can be employed for insulating base member 11, however, insulating base member 11 is not limited thereto.

A thickness of insulating base member 11 can be, for example, not smaller than 10 μm and not greater than 200 μm and it is particularly preferably around 25

A layer composed, for example, of such a metal as copper can be employed as conductive layer 71, however, conductive layer 71 is not limited thereto.

Then, as shown in FIG. 9 (*b*), a resist pattern 72 is formed on conductive layer 71 on the surface of insulating base member 11. Here, resist pattern 72 is formed in a shape having an opening in a location other than locations where wire for n-type 12, wire for p-type 13, and wire for connection 14 are to be formed. For example, a conventionally known resist can be used as a resist forming resist pattern 72, and the resist is applied with such a method as screen printing, application with a dispenser, or ink jet application. It is noted that an opening in the resist is naturally placed at a location corresponding to a location where recess 62 is to be formed.

Then, as shown in FIG. 9 (c), conductive layer 71 at a location exposed through resist pattern 72 is removed in a direction shown with an arrow 73 to thereby pattern conductive layer 71, wire for n-type 12, wire for p-type 13, and wire for connection 14 are formed from the remainder of conductive layer 71, and a portion from which conductive layer 71 forming a part of wire for connection 14 has been removed serves as recess 62.

Removal of conductive layer 71 can be achieved, for example, through wet etching or the like using a solution of acid or alkali.

Then, as shown in FIG. 9 (d), resist pattern 72 is completely removed from the surface of wire for n-type 12, wire for p-type 13, and wire for connection 14, to thereby fabricate interconnection sheet 10.

<Method of Manufacturing Back Electrode Type Solar Cell with Interconnection Sheet>

One example of a method of manufacturing the back electrode type solar cell with interconnection sheet shown in FIG. 7 will be described hereinafter with reference to schematic cross-sectional views in FIGS. 10 (a) to 10 (e).

Figure 10:
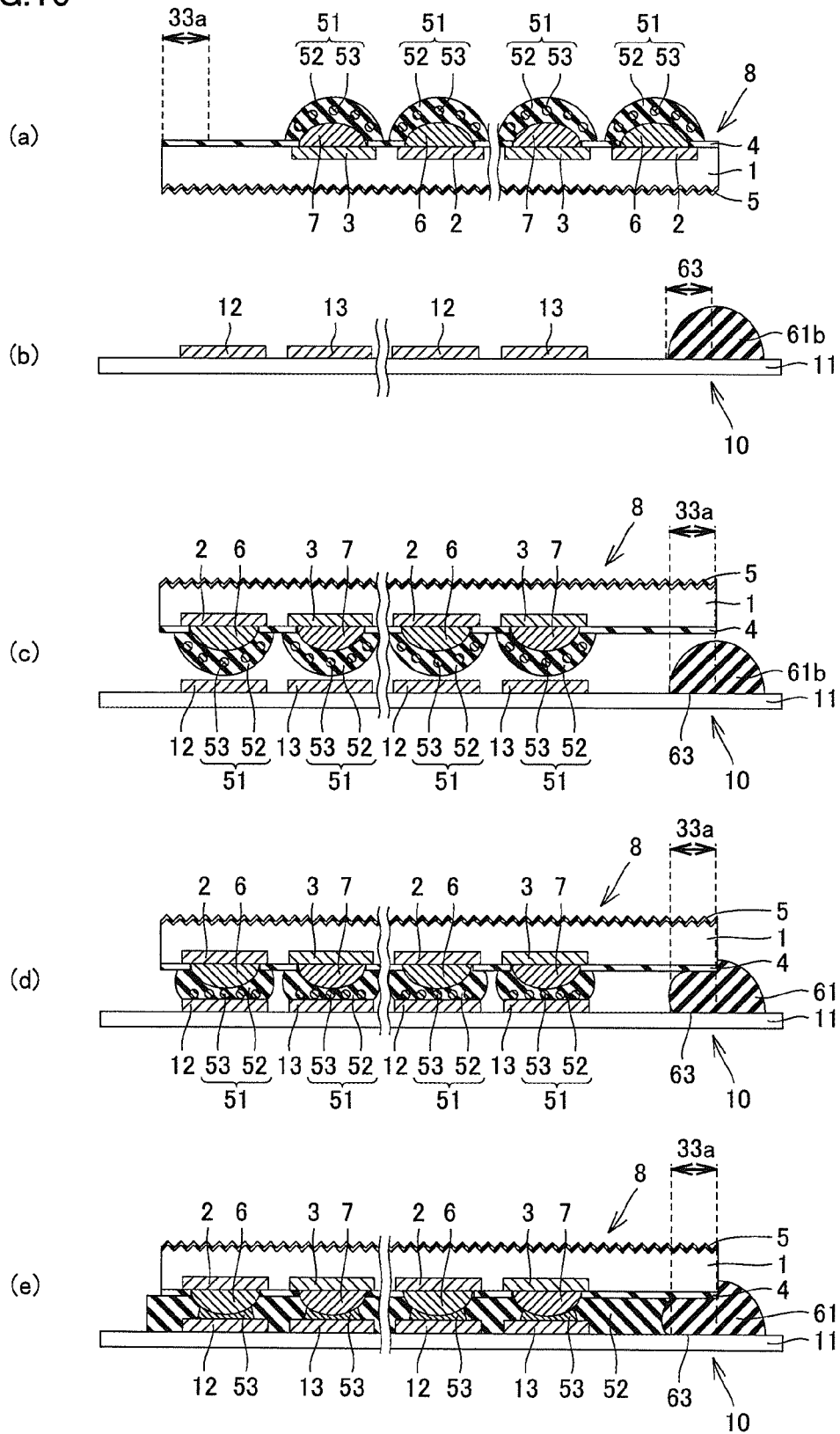
FIGS. 10 (a) to (e) are schematic cross-sectional views illustrating one example of a method of manufacturing a back electrode type solar cell with interconnection sheet shown in FIG. 7.

Initially, as shown in FIG. 10 (a), the step of placing a solder resin 51 on the surface of each of electrode for n-type 6 and electrode for p-type 7 of back electrode type solar cell 8 is performed. Solder resin 51 contains insulating adhesive material 52 and conductive adhesive material 53 and it is composed such that conductive adhesive material 53 is dispersed in insulating adhesive material 52. For example, TCAP-5401-27 manufactured by Tamura Kaken Corporation or the like can be employed as solder resin 51.

For example, thermosetting and/or light curing insulating resin etc. containing as a resin component, at least one selected from the group consisting of an epoxy resin, an acrylic resin, and a urethane resin can be employed as insulating adhesive material 52.

For example, solder particles containing at least one of tin and bismuth, or the like can be employed for conductive adhesive material 53, and more preferably conductive adhesive material 53 is made of an alloy of tin and bismuth, indium, silver, or the like. Thus, a melting point of the solder can be lowered and a heating temperature in the step of curing conductive adhesive material 53 after it is molten which will be described later can be lowered, so that warpage or the like of back electrode type solar cell 8 can be suppressed.

For example, such a method as screen printing, application with a dispenser, or ink jet application can be used as a method of placing solder resin 51, and among these, screen printing is preferably used. In a case of using screen printing, solder resin 51 can be placed in a simplified manner, with low cost, and in a short period of time.

Though a case where solder resin 51 is placed on an electrode of back electrode type solar cell 8 is described in the present embodiment, solder resin 51 may be placed on a wire of interconnection sheet 10 and solder resin 51 may be placed on both of the electrode of back electrode type solar cell 8 and the wire of interconnection sheet 10. In addition, though a case where a solder resin is employed as an insulating adhesive material containing a conductive adhesive material is described in the present embodiment, a solder paste (a paste composed of solder particles dispersed in a flux) or the like can also be employed other than the solder resin. In this case as well, solder having a low melting point is preferably employed as described above.

In addition, in a case where back electrode type solar cell 8 includes alignment mark 41, no conductive adhesive material 53 is preferably placed on alignment mark 41. In this case, such a problem as lowering in accuracy in recognition of alignment mark 41 due to conductive adhesive material 53 extending off alignment mark 41 or the like is less likely, and registration between back electrode type solar cell 8 and interconnection sheet 10 tends to more accurately be achieved in the step of superimposing back electrode type solar cell 8 and interconnection sheet 10 on each other which will be described later. Moreover, even when an uncured insulating adhesive material 61b is in contact with alignment mark 41 in the step of superimposing back electrode type solar cell 8 and interconnection sheet 10 on each other which will be described later, conductive adhesive material 53 does not flow into insulating adhesive material 61b, so that a distance between alignment mark 41 and no-electrode-formed region 33a or the like can further be made smaller or alignment mark 41 can be arranged in an inner region of no-electrode-formed region 33a or the like. Since a region from which generated electric power can be extracted (a region where an electrode is formed) can thus further be made larger, lowering in power generation efficiency tends to further be suppressed.

Then, as shown in FIG. 10 (b), the step of placing uncured insulating adhesive material 61b in a region of interconnection sheet 10 including opposing region 63 of insulating base member 11 is performed. Here, uncured insulating adhesive material 61b is placed on at least one of no-electrode-formed region 33a, 33b, 33c, 33d of back electrode type solar cell 8 and opposing region 63 of interconnection sheet 10.

Though a case where insulating adhesive material 61b is placed on opposing region 63 of interconnection sheet 10 is described in the present embodiment, insulating adhesive material 61b may be placed on at least a part of no-electrode-formed region 33a, 33b, 33c, 33d of back electrode type solar cell 8 and insulating adhesive material 61b may be placed on both of at least a part of no-electrode-formed region 33a, 33b, 33c, 33d of back electrode type solar cell 8 and at least a part of opposing region 63 of interconnection sheet 10.

In addition, opposing region 63 of interconnection sheet 10 is a region of interconnection sheet 10 opposed to a no-electrode-formed region of back electrode type solar cell 8 at the time when back electrode type solar cell 8 and interconnection sheet 10 are superimposed on each other to make a back electrode type solar cell with interconnection sheet or a solar cell module. In a case where recess 62 is formed in interconnection sheet 10 as shown in FIG. 8, opposing region 63 preferably overlaps with at least a part of recess 62. Thus, insulating adhesive material 61b placed on opposing region 63 can effectively be prevented from entering the inner side relative to no-electrode-formed region 33a or the like of back electrode type solar cell 8.

For example, thermosetting and/or light curing insulating resin etc. containing as a resin component, at least one selected from the group consisting of an epoxy resin, an acrylic resin, and a urethane resin can be employed as insulating adhesive material 61b.

Among others, an ultraviolet curable epoxy resin is preferably employed as insulating adhesive material 61b. In this case, insulating adhesive material 61b in a portion irradiated with ultraviolet rays can selectively be cured by irradiation of insulating adhesive material 61b with ultraviolet rays (light having a wavelength not shorter than 1 nm and not longer than 400 nm). Thus, in fixing back electrode type solar cell 8 and interconnection sheet 10 by using insulating adhesive material 61 which will be described later, only insulating adhesive material 61b can be cured, so that melting of conductive adhesive material 53 due to heating of solder resin 51 can be prevented and hence stability in electrical connection between the electrode of back electrode type solar cell 8 and the wire of interconnection sheet 10 can be improved.

For example, such a method as screen printing, application with a dispenser, or ink jet application can be employed as a method of placing insulating adhesive material 61b, and among these, application with a dispenser is preferably employed. In a case of using application with a dispenser, insulating adhesive material 61b in an appropriate amount can be placed at a proper position between the peripheral portion of back electrode type solar cell 8 and interconnection sheet 10.

In addition, the order of performing the step of placing solder resin 51 and the step of placing insulating adhesive material 61b is not particularly limited. The step of placing solder resin 51 may be performed prior to the step of placing insulating adhesive material 61b, or the step of placing insulating adhesive material 61b may be performed prior to the step of placing solder resin 51. Alternatively, these steps may be performed simultaneously.

Then, as shown in FIG. 10 (c), the step of superimposing back electrode type solar cell 8 and interconnection substrate 10 on each other is performed.

In the step of superimposing back electrode type solar cell 8 and interconnection sheet 10 on each other is performed, for example, with such registration that electrode for n-type 6 and electrode for p-type 7 of back electrode type solar cell 8 are opposed to wire for n-type 12 and wire for p-type 13 provided on insulating base member 11 of interconnection sheet 10, respectively. Here, no-electrode-formed region 33a of back electrode type solar cell 8 is opposed to opposing region 63 of interconnection sheet 10, and insulating adhesive material 61b is located between no-electrode-formed region 33a of back electrode type solar cell 8 and opposing region 63 of interconnection sheet 10. Therefore, uncured insulating adhesive material 61b comes in contact only with no-electrode-formed region 33a of back electrode type solar cell 8 and does not come in contact with a portion where an electrode is formed. Therefore, since conductive adhesive material 53 placed on the surface of each of electrode for n-type 6 and electrode for p-type 7 of back electrode type solar cell 8 and insulating adhesive material 61b can be located at a distance from each other, such a problem that conductive adhesive material 53 flows out in between the electrodes of back electrode type solar cell 8 and/or the wires of interconnection sheet 10 through insulating adhesive material 61b, which leads to short-circuiting between the electrodes and/or the wires, can be prevented.

Here, in a case where back electrode type solar cell 8 includes alignment mark 41, the step of superimposing back electrode type solar cell 8 and interconnection sheet 10 on each other is preferably performed such that alignment mark 41 of back electrode type solar cell 8 is opposed to a prescribed surface region of interconnection sheet 10. Since insulating adhesive material 61b is uncured at this stage, registration between back electrode type solar cell 8 and interconnection sheet 10 can readily be achieved and hence stability in electrical connection between the electrode of back electrode type solar cell 8 and the wire of interconnection sheet 10 and stability in mechanical connection between back electrode type solar cell 8 and interconnection sheet 10 can be improved.

It is noted that the prescribed surface region of interconnection sheet 10 opposed to alignment mark 41 of back electrode type solar cell 8 can be set as appropriate, in consideration of stability in electrical connection and/or stability in mechanical connection described above etc. above.

Then, as shown in FIG. 10 (d), after back electrode type solar cell 8 and interconnection sheet 10 are superimposed on each other, the step of curing insulating adhesive material 61b is performed. Thus, uncured insulating adhesive material 61b becomes cured insulating adhesive material 61.

Here, a method of curing insulating adhesive material 61b can be exemplified by a method of heating insulating adhesive material 61b and/or a method of irradiation with such light as ultraviolet rays, etc. Thus, uncured insulating adhesive material 61b is cured to become cured insulating adhesive material 61. It is noted that insulating adhesive material 61b at this stage does not have to be in a completely cured state and it should only be cured to such an extent as not being mixed with molten conductive adhesive material 53 at least in the subsequent step of curing conductive adhesive material 53 after it is molten.

Then, the step of curing conductive adhesive material 53 after it is molten is performed. Here, the step of curing conductive adhesive material 53 after it is molten can be performed, for example, by heating solder resin 51 while a pressure is applied to back electrode type solar cell 8 and interconnection sheet 10 to thereby melt conductive adhesive material 53 in solder resin 51 and thereafter cooling conductive adhesive material 53.

Here, as shown in FIG. 10 (e), molten conductive adhesive material 53 aggregates between at least a part of the surface of electrode for n-type 6 of back electrode type solar cell 8 and at least a part of the surface of wire for n-type 12 of interconnection sheet 10 and also aggregates between at least one of the surface of electrode for p-type 7 of back electrode type solar cell 8 and at least a part of the surface of wire for p-type 13 of interconnection sheet 10. Thereafter, molten conductive adhesive material 53 is cooled and thus solidified in an aggregated state.

In addition, as a result of heating of solder resin 51, viscosity of insulating adhesive material 52 lowers and moves into a region between the electrodes of back electrode type solar cell 8 and the region between the wires of interconnection sheet 10. Thereafter, as a result of further heating of insulating adhesive material 52, it is cured at that position after its movement.

Furthermore, in a case where insulating adhesive material 61 has not completely been cured, insulating adhesive material 61 is also heated along with heating of solder resin 51 so that insulating adhesive material 61 is completely cured.

As above, the back electrode type solar cell with interconnection sheet shown in FIG. 7 can be fabricated.

<Solar Cell Module>

Figure 11:
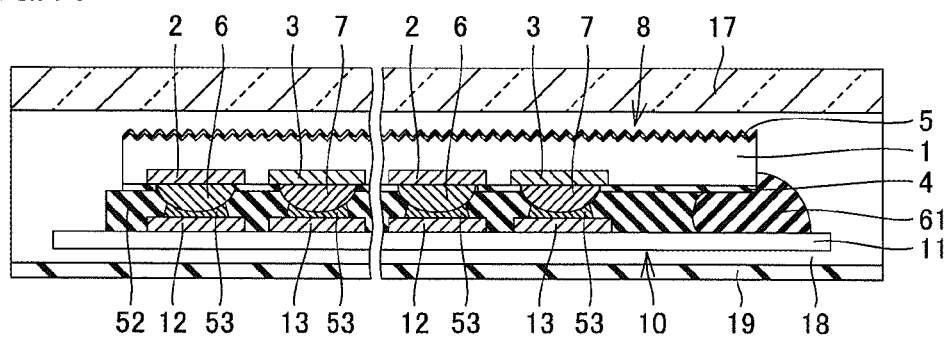
FIG. 11 is a schematic cross-sectional view of one example of a solar cell module in the present embodiment.

The back electrode type solar cell with interconnection sheet fabricated as described above is made into a solar cell module according to the present embodiment by being sealed in sealing material 18 located between light-transmitting substrate 17 and protection base member 19, for example, as shown in a schematic cross-sectional view in FIG. 11.

The solar cell module in the present embodiment can be fabricated, for example, by sandwiching the back electrode type solar cell with interconnection sheet between sealing material 18 composed of ethylene vinyl acetate (EVA) or the like and provided for light-transmitting substrate 17 made of glass or the like and sealing material 18 composed of EVA or the like and provided for protection base member 19 made of a polyester film or the like, heating light-transmitting substrate 17 and protection base member 19 while they are pressed against each other, and curing these sealing materials 18 for integration after they are molten.

In the present embodiment, during a period from placement of uncured insulating adhesive material 61*b* until uncured insulating adhesive material 61*b* is cured to obtain cured insulating adhesive material 61, insulating adhesive material 61*b* and conductive adhesive material 53 in solder resin 51 are located at a distance from each other. Thus, mixing between insulating adhesive material 61*b* and conductive adhesive material 53 due to flow of insulating adhesive material 61*b* can be suppressed.

In addition, in the present embodiment, at least one of no-electrode-formed regions 33*a*, 33*b*, 33*c*, 33*d* is arranged to be adjacent to electrode for n-type 6 and electrode for p-type 7 which are adjacent to each other. In a case where insulating adhesive material 61 is introduced in a portion where electrode for n-type 6 and electrode for p-type 7 are adjacent to each other, defective electrical connection due to short-circuiting between electrode for n-type 6 and electrode for p-type 7 is likely. As in the present embodiment, however, by arranging no-electrode-formed region 33*a*, 33*b*, 33*c*, 33*d* in the portion where electrode for n-type 6 and electrode for p-type 7 are located adjacent to each other, for example even in a case where uncured insulating adhesive material 61*b* deforms due to application of a pressure to back electrode type solar cell 8 and interconnection sheet 10 or the like, insulating adhesive material 61*b* is accommodated in no-electrode-formed region 33*a*, 33*b*, 33*c*, 33*d* and it can be prevented from entering the portion where electrode for n-type 6 and electrode for p-type 7 are adjacent to each other.

For the above reasons, in the present embodiment, stability in mechanical connection between back electrode type solar cell 8 and interconnection sheet 10 can be improved and stability in electrical connection between the electrode of back electrode type solar cell 8 and the wire of interconnection sheet 10 can also be improved.

In addition, in the above, at least two no-electrode-formed regions are preferably provided in the back surface of back electrode type solar cell 8. In this case, since two or more locations where back electrode type solar cell 8 and interconnection sheet 10 are fixed by means of insulating adhesive material 61 can be provided, stability in mechanical connection between back electrode type solar cell 8 and interconnection sheet 10 tends to further be improved.

Moreover, in the above, at least two no-electrode-formed regions are preferably provided in the vicinity of respective parts of the peripheral portion located diagonally, with center C of the back surface of back electrode type solar cell 8 lying therebetween, for example, as shown in FIG. 1. In this case, since locations where back electrode type solar cell 8 and interconnection sheet 10 are fixed by means of insulating adhesive material 61 can be set to respective positions at opposing corners with center C of the back surface of back electrode type solar cell 8 lying therebetween, stability in mechanical connection between back electrode type solar cell 8 and interconnection sheet 10 tends to further be improved. For example, the no-electrode-formed regions are preferably provided in the vicinity of respective parts 31*a* and 31*c* of the peripheral portion shown in FIG. 1 and/or in the vicinity of respective parts 31*b* and 31*d* of the peripheral portion.

<Other Embodiments>

The solar cell module in the present embodiment can be manufactured, for example, also with the following manufacturing method.

Initially, after the step of placing solder resin 51 on the surface of each of electrode for n-type 6 and electrode for p-type 7 of back electrode type solar cell 8 is performed as shown in FIG. 10 (*a*), the step of placing uncured insulating adhesive material 61*b* on opposing region 63 of interconnection sheet 10 is performed as shown in FIG. 10 (*b*).

Then, the step of superimposing back electrode type solar cell 8 and interconnection substrate 10 on each other is performed as shown in FIG. 10 (*c*), and the step of curing insulating adhesive material 61*b* to obtain cured insulating adhesive material 61 is performed as shown in FIG. 10 (*d*). The steps so far are the same as above.

Figure 12:
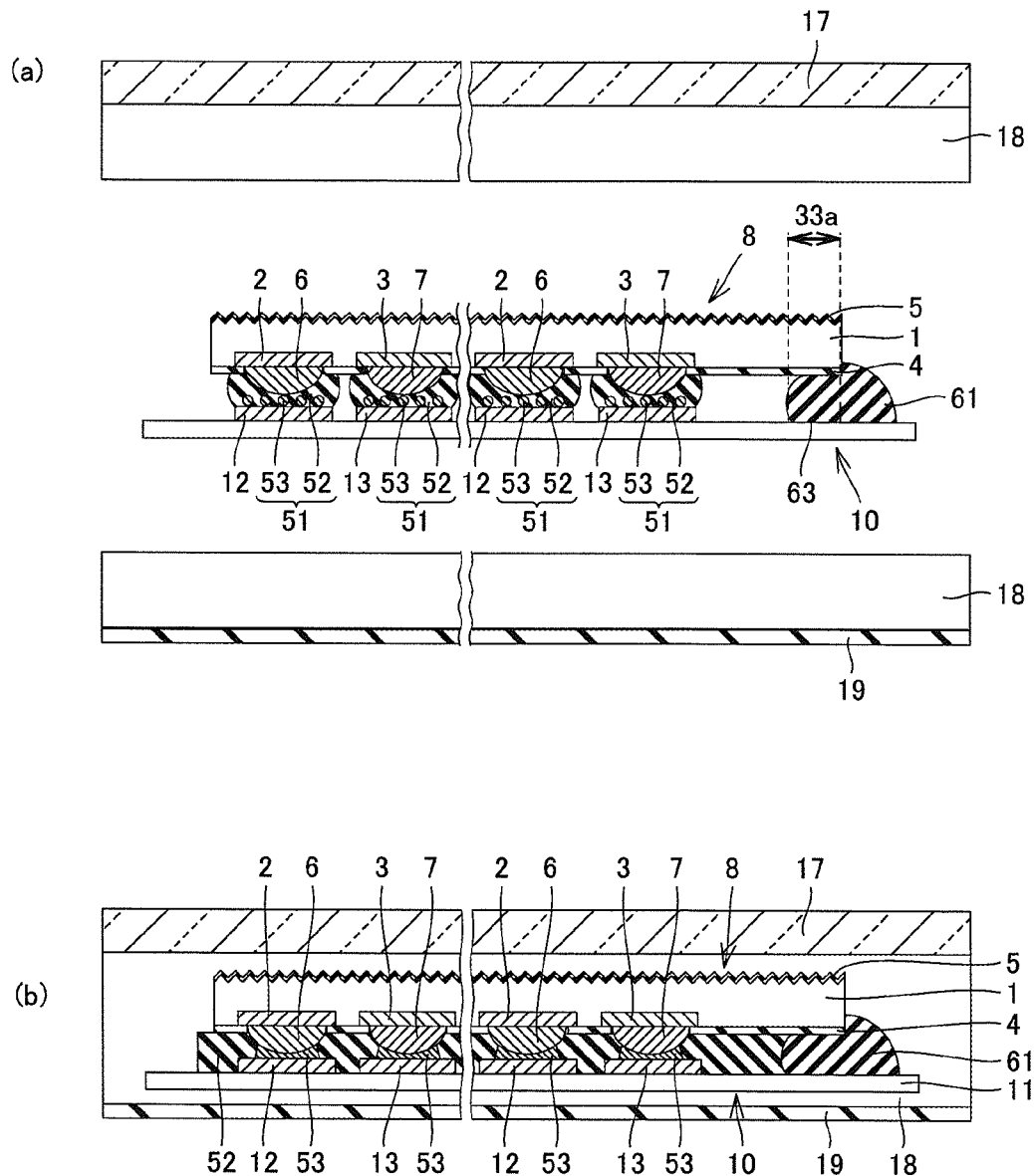
FIG. 12 is a schematic cross-sectional view illustrating another example of a method of manufacturing a solar cell module in the present embodiment.

Then, as shown in a schematic cross-sectional view in FIG. 12 (*a*), back electrode type solar cell 8 and interconnection sheet 10 sandwiched between sealing materials 18 are placed between light-transmitting substrate 17 and protection base member 19. Here, back electrode type solar cell 8 and interconnection sheet 10 are superimposed on each other while they are fixed by cured insulating adhesive material 61 between no-electrode-formed region 33*a* of back electrode type solar cell 8 and opposing region 33 of interconnection sheet 10.

Then, as shown in a schematic cross-sectional view in FIG. 12 (*b*), back electrode type solar cell 8 and interconnection sheet 10 are sealed in sealing material 18 between light-transmitting substrate 17 and protection base member 19 by heating and softening sealing material 18 while pressure is applied to light-transmitting substrate 17 and protection base member 19 and thereafter cooling and curing sealing material 18. The solar cell module in the present embodiment is thus fabricated.

It is noted that solder resin 51 is also heated in heating of sealing material 18. Thus, as shown in FIG. 12 (*b*), conductive adhesive material 53 is molten and aggregates between at least a part of the surface of electrode for n-type 6 of back electrode type solar cell 8 and at least a part of the surface of wire for n-type 12 of interconnection sheet 10 and also aggregates between at least a part of the surface of electrode for p-type 7 of back electrode type solar cell 8 and at least a part of the surface of wire for p-type 13 of interconnection sheet 10. Thereafter, molten conductive adhesive material 53 is cooled and thus solidified in an aggregated state.

In this form as well, an adhesive material made of a material molten at a low temperature is preferably employed for conductive adhesive material 53. For example, in a case where ethylene vinyl acetate (EVA) or the like is employed for sealing material 18, the melting point of conductive adhesive material 53 is preferably not higher than 150° C. Thus, sealing material 18 can be prevented from decomposing, foaming, and being embrittled due to heating of conductive adhesive material 53. In a case where solder is employed for conductive adhesive material 53, the melting point can be not higher than 150° C. by employing an alloy of tin and bismuth, indium, silver, or the like as described above. It has been known, however, that solder low in melting point is brittle, and the present embodiment in which mechanical connection between back electrode type solar cell 8 and interconnection sheet 10 can be securer is useful.

In addition, as a result of heating of insulating adhesive material 52, viscosity thereof lowers and moves into a region between the electrodes of back electrode type solar cell 8 and a region between the wires of interconnection sheet 10. Thereafter, as a result of further heating, insulating adhesive material 52 is cured at that position after its movement.

In this form as well, during a period from placement of uncured insulating adhesive material 61*b* until uncured insulating adhesive material 61*b* is cured to obtain cured insulating adhesive material 61, insulating adhesive material 61*b* and conductive adhesive material 53 in solder resin 51 are located at a distance from each other. Thus, mixing between insulating adhesive material 61b and conductive adhesive material 53 due to flow of insulating adhesive material 61b can be suppressed. Therefore, stability in mechanical connection between back electrode type solar cell 8 and interconnection sheet 10 can be improved and stability in electrical connection between the electrode of back electrode type solar cell 8 and the wire of interconnection sheet 10 can also be improved. The description is otherwise the same as described above.

It should be understood that the embodiments disclosed herein are illustrative and non-restrictive in every respect. The scope of the present invention is defined by the terms of the claims, rather than the description above, and is intended to include any modifications within the scope and meaning equivalent to the terms of the claims.

Industrial Applicability

The present invention can be made use of in a back electrode type solar cell, a back electrode type solar cell with interconnection sheet, a solar cell module, a method of manufacturing a back electrode type solar cell with interconnection sheet, and a method of manufacturing a solar cell module.

Reference Signs List 1 substrate; 1a slice damage; 2 n-type impurity diffusion region; 3 p-type impurity diffusion region; 4 passivation film, 4a, 4b contact hole; 5 anti-reflection coating; 6 electrode for n-type; 6a end portion; 7 electrode for p-type; 7a end portion; 8 back electrode type solar cell; 10 interconnection substrate; 11 insulating base member; 12 wire for n-type; 13 wire for p-type; 17 light-transmitting substrate; 18 sealing material; 19 protection base member; 30a, 30b, 30c, 30d, 31a, 31b, 31c, 31d part of peripheral portion; 33a, 33b, 33c, 33d no-electrode-formed region; 34 lower base; 35 upper base; 36 height; 41 alignment mark; 51 solder resin; 52, 61 insulating adhesive material; 53 conductive adhesive material; 62 recess; 63 opposing region; 71 conductive layer; 72 resist pattern; and 73 arrow.

The invention claimed is:

1. A back electrode type solar cell, comprising:
a substrate; and
a plurality of electrodes provided on a back surface which is one surface of said substrate,
in a part of a peripheral portion of said back surface of said back electrode type solar cell, a no-electrode-formed region where no said electrode is placed being provided such that a line connecting end portions of said plurality of electrodes to one another includes a partially inwardly recessed region,
said plurality of electrodes including an electrode for n-type and an electrode for p-type adjacent to each other, and
said no-electrode-formed region being located adjacent to each of said electrode for n-type and said electrode for p-type.

2. The back electrode type solar cell according to claim 1, wherein
said no-electrode-formed region is a round or polygonal region of which length of a portion in contact with the part of said peripheral portion of said back surface of said back electrode type solar cell is longest.

3. The back electrode type solar cell according to claim 1, wherein
at least two said no-electrode-formed regions are provided in said back surface of said back electrode type solar cell.

4. The back electrode type solar cell according to claim 3, wherein
at least two said no-electrode-formed regions are provided in vicinity of the parts of said peripheral portion located diagonally, respectively, with a center of said back surface of said back electrode type solar cell lying therebetween.

5. The back electrode type solar cell according to claim 1, wherein
an alignment mark different in surface shape from said electrode for n-type and said electrode for p-type is provided in a region around said no-electrode-formed region.

6. The back electrode type solar cell according to claim 1, wherein
an alignment mark different in surface shape from said electrode for n-type and said electrode for p-type is provided in an inner region of said no-electrode-formed region.

7. A back electrode type solar cell with interconnection sheet, comprising:
a back electrode type solar cell including a substrate and an electrode provided on a back surface which is one surface of said substrate, the back surface having, a no-electrode-formed region where no said electrode is placed being provided in a part of a peripheral portion of said back surface, said electrode including an electrode for n-type and an electrode for p-type adjacent to each other, and said no-electrode-formed region being located adjacent to each of said electrode for n-type and said electrode for p-type;
an interconnection sheet having an insulating base member and a wire provided on at least one surface of said insulating base member;
a conductive adhesive material located between said electrode of said back electrode type solar cell and said wire of said interconnection sheet, for electrically connecting said electrode and said wire to each other; and
an insulating adhesive material located between said no-electrode-formed region of said back electrode type solar cell and an opposing region of said interconnection sheet opposed to said no-electrode-formed region, for mechanically connecting said no-electrode-formed region and said opposing region to each other.

8. A back electrode type solar cell with interconnection sheet, comprising:
the back electrode type solar cell according to claim 5;
an interconnection sheet having an insulating base member and a wire provided on at least one surface of said insulating base member;
a conductive adhesive material located between said electrode of said back electrode type solar cell and said wire of said interconnection sheet, for electrically connecting said electrode and said wire to each other; and
an insulating adhesive material located between said no-electrode-formed region of said back electrode type solar cell and an opposing region of said interconnection sheet opposed to said no-electrode-formed region, for mechanically connecting said no-electrode-formed region and said opposing region to each other,
no said conductive adhesive material being placed on said alignment mark.

9. The back electrode type solar cell with interconnection sheet according to claim 7, wherein
said conductive adhesive material and said insulating adhesive material are located at a distance from each other.

10. A solar cell module, comprising:
a light-transmitting substrate;
a protection base member;
a sealing material located between said light-transmitting substrate and said protection base member; and
the back electrode type solar cell with interconnection sheet according to claim 7, sealed in said sealing material.

11. A method of manufacturing the back electrode type solar cell with interconnection sheet according to claim 7, comprising the steps of:
placing a conductive adhesive material on at least one of said electrode of said back electrode type solar cell and said wire of said interconnection sheet;
placing an insulating adhesive material on at least one of said no-electrode-formed region of said back electrode type solar cell and said opposing region of said interconnection sheet;
superimposing said back electrode type solar cell and said interconnection sheet on each other;
curing said insulating adhesive material; and
curing said conductive adhesive material after it is molten,
during a period from placement of said insulating adhesive material until curing of said insulating adhesive material, said conductive adhesive material and said insulating adhesive material being located at a distance from each other.

12. A method of manufacturing the back electrode type solar cell with interconnection sheet according to claim 8, comprising the steps of:
placing a conductive adhesive material on at least one of said electrode of said back electrode type solar cell and said wire of said interconnection sheet;
placing an insulating adhesive material on at least one of said no-electrode-formed region of said back electrode type solar cell and said opposing region of said interconnection sheet;
superimposing said back electrode type solar cell and said interconnection sheet on each other such that said alignment mark of said back electrode type solar cell is opposed to a prescribed surface region of said interconnection sheet;
curing said insulating adhesive material; and
curing said conductive adhesive material after it is molten,
during a period from placement of said insulating adhesive material until curing of said insulating adhesive material, said conductive adhesive material and said insulating adhesive material being located at a distance from each other.

13. The method of manufacturing the back electrode type solar cell with interconnection sheet according to claim 11, wherein
said conductive adhesive material is contained in a solder resin.

14. A method of manufacturing the solar cell module according to claim 10, comprising the steps of:
placing a conductive adhesive material on at least one of said electrode of said back electrode type solar cell and said wire of said interconnection sheet;
placing an insulating adhesive material on at least one of said no-electrode-formed region of said back electrode type solar cell and said opposing region of said interconnection sheet;
superimposing said back electrode type solar cell and said interconnection sheet on each other;
curing said insulating adhesive material; and
sealing said back electrode type solar cell and said interconnection sheet in the sealing material between said light-transmitting substrate and said protection base member,
in said sealing step, the step of curing said conductive adhesive material after it is molten being performed, and,
during a period from placement of said insulating adhesive material until curing of said insulating adhesive material, said conductive adhesive material and said insulating adhesive material being located at a distance from each other.

* * * * *